United States Patent
Kanbe

(10) Patent No.: US 10,032,685 B2
(45) Date of Patent: Jul. 24, 2018

(54) ELECTRONIC COMPONENT AND CIRCUIT MODULE

(71) Applicant: MURATA MANUFACTURING CO., LTD., Kyoto-fu (JP)

(72) Inventor: Yuki Kanbe, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 15/636,688

(22) Filed: Jun. 29, 2017

(65) Prior Publication Data

US 2018/0019176 A1 Jan. 18, 2018

(30) Foreign Application Priority Data

Jul. 14, 2016 (JP) .................................. 2016-139626

(51) Int. Cl.

| | |
|---|---|
| *H01L 23/32* | (2006.01) |
| *H05K 1/11* | (2006.01) |
| *H01L 23/14* | (2006.01) |
| *H01L 23/13* | (2006.01) |
| *H05K 1/18* | (2006.01) |
| *H05K 3/34* | (2006.01) |
| *H01G 4/33* | (2006.01) |

(52) U.S. Cl.
CPC .............. *H01L 23/32* (2013.01); *H01G 4/33* (2013.01); *H01L 23/13* (2013.01); *H01L 23/14* (2013.01); *H05K 1/11* (2013.01); *H05K 1/181* (2013.01); *H05K 3/34* (2013.01)

(58) Field of Classification Search
CPC combination set(s) only.
See application file for complete search history.

(56) References Cited

U.S. PATENT DOCUMENTS

| | | | | |
|---|---|---|---|---|
| 5,598,135 | A | * | 1/1997 | Maeda ................ H01F 17/0013 336/200 |
| 7,084,730 | B2 | * | 8/2006 | Kitagawa ............. H01F 17/045 336/192 |
| 2005/0057334 | A1 | * | 3/2005 | Kitagawa ............. H01F 17/045 336/83 |
| 2009/0002112 | A1 | * | 1/2009 | Atsushi ................ H01F 17/045 336/83 |

(Continued)

FOREIGN PATENT DOCUMENTS

JP 2007-103596 A 4/2007

*Primary Examiner* — Lisa Lea Edmonds
(74) *Attorney, Agent, or Firm* — Studebaker & Brackett PC

(57) ABSTRACT

An electronic component includes a core, a winding, and an electrode. A flange of the core includes a body having a first surface that faces a top side and is located on the top side of a winding core of the core and first and second electrode formation portions protruding toward the top side of the first surface. The electrode is provided on a second surface of the first electrode formation portion and is connected to the winding. Space surrounded by the first and second electrode formation portions and the first surface is formed. A predetermined section between a point where the winding is separated from the winding core and a point where the winding comes into contact with the electrode extends toward the upper right side as viewed from the front, and does not include a portion of the winding an entire line width of which overlaps the space.

7 Claims, 15 Drawing Sheets

(56) References Cited

U.S. PATENT DOCUMENTS

| | | | |
|---|---|---|---|
| 2010/0188798 A1* | 7/2010 | Togashi | H01G 2/06 |
| | | | 361/306.3 |
| 2014/0104026 A1* | 4/2014 | Shiokawa | H01F 27/29 |
| | | | 336/192 |
| 2014/0247105 A1* | 9/2014 | Hashimoto | H01F 17/03 |
| | | | 336/221 |
| 2015/0116891 A1* | 4/2015 | Park | H01G 4/40 |
| | | | 361/270 |
| 2015/0162126 A1* | 6/2015 | Kanbe | H01F 27/2823 |
| | | | 336/192 |
| 2016/0240306 A1* | 8/2016 | Kanbe | H01F 27/292 |
| 2017/0069418 A1* | 3/2017 | Yamakita | H01F 41/069 |
| 2017/0125166 A1* | 5/2017 | Muneuchi | H01F 41/06 |
| 2017/0148560 A1* | 5/2017 | Yoon | H01F 27/2804 |

* cited by examiner

FIG.1
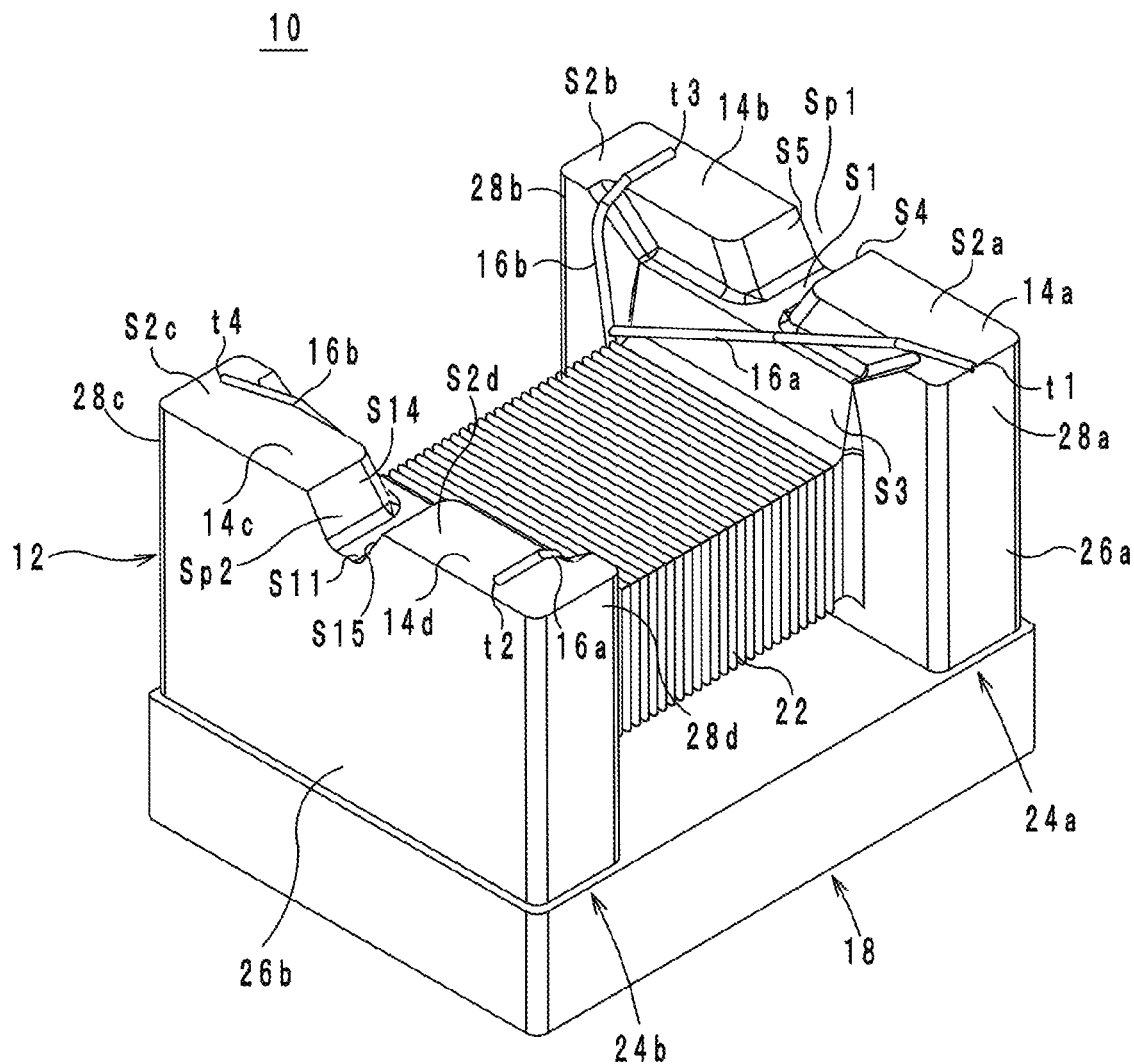
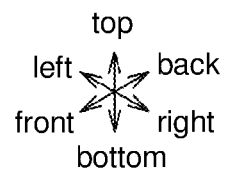

FIG.2
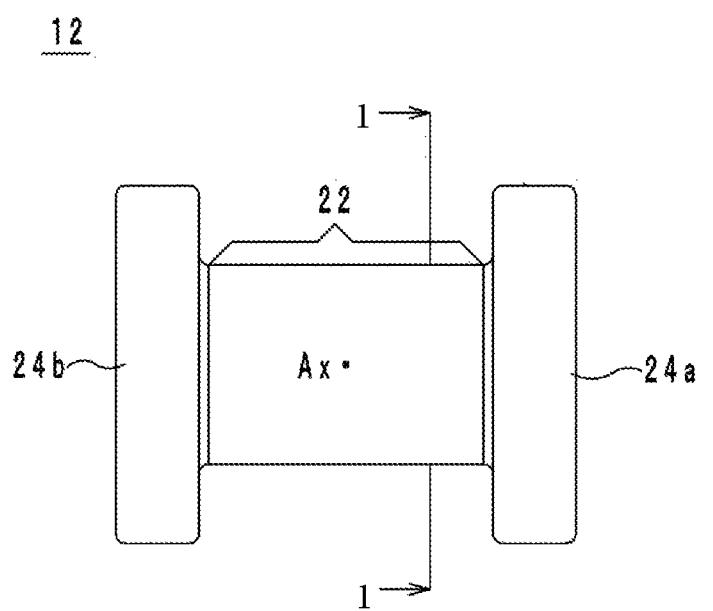
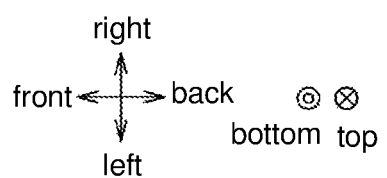

FIG.3
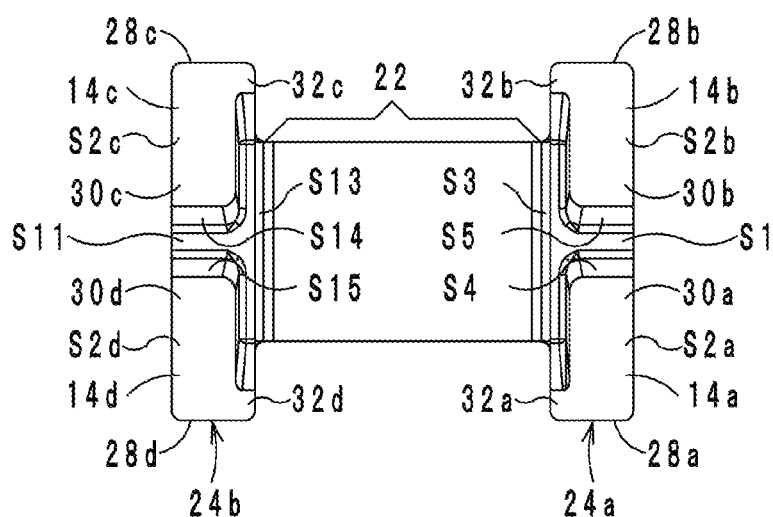
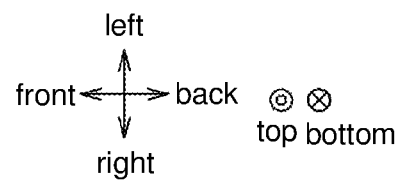

FIG. 4
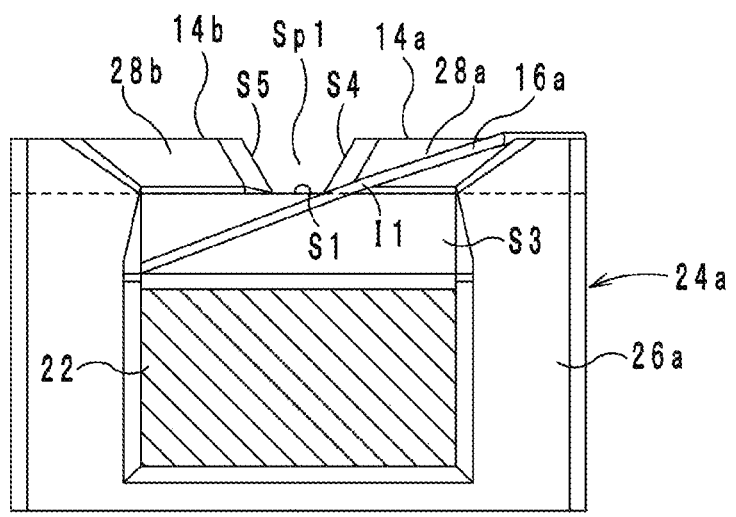
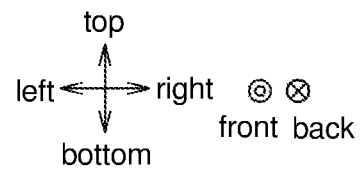

FIG.7
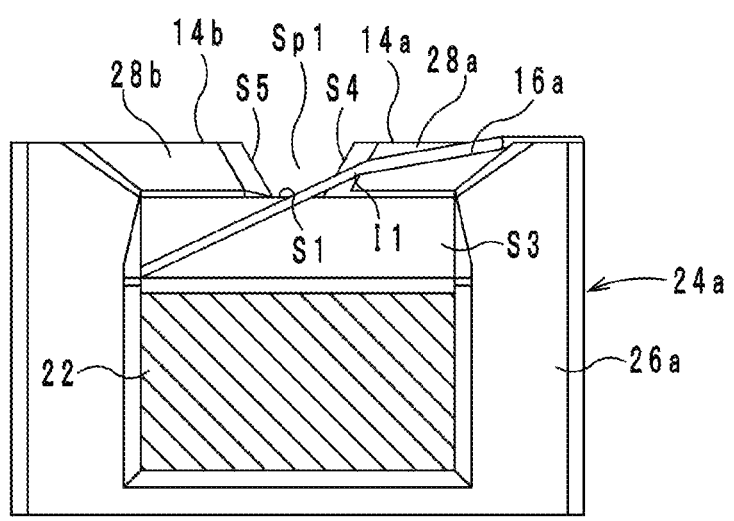
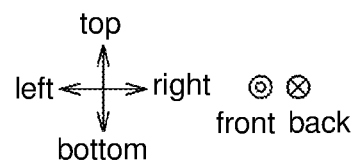

FIG. 11
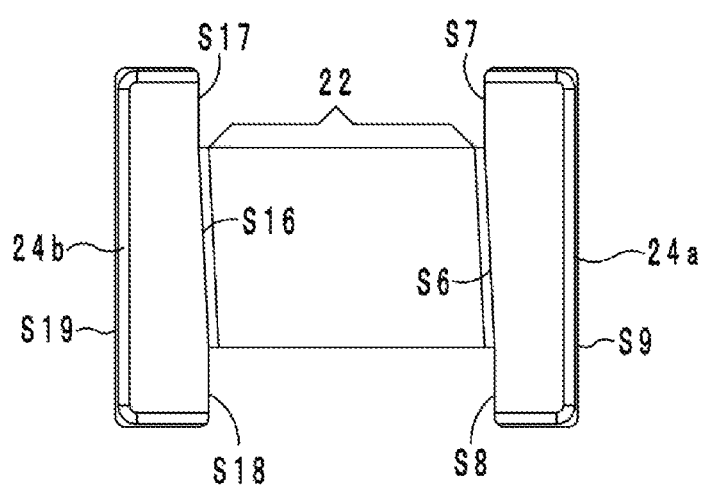
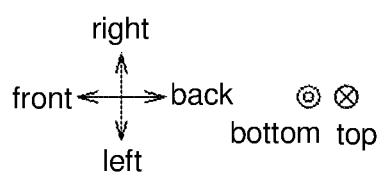

FIG.12
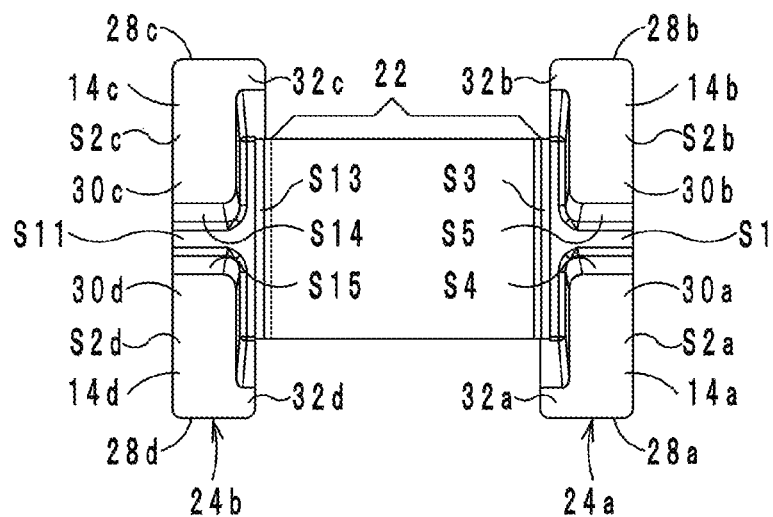
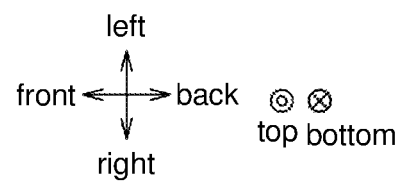

ELECTRONIC COMPONENT AND CIRCUIT MODULE

CROSS REFERENCE TO RELATED APPLICATIONS

This application claims benefit of priority to Japanese Patent Application 2016-139626 filed Jul. 14, 2016, the entire content of which is incorporated herein by reference.

TECHNICAL FIELD

The present disclosure relates to an electronic component including a wound-type coil and a circuit module.

BACKGROUND

As a disclosure relating to an electronic component in the related art, for example, a winding chip-type common mode choke coil disclosed in Japanese Unexamined Patent Application Publication No. 2007-103596 is known. FIG. 13 is a perspective view of a common mode choke coil 500 disclosed in Japanese Unexamined Patent Application Publication No. 2007-103596. In FIG. 13, a direction in which a winding core portion 511 extends is defined as a front-back direction, a direction in which leg-shaped electrode portions 515a and 515b are arranged is defined as a left-right direction, and a direction orthogonal to the front-back direction and the left-right direction is defined as a top-bottom direction.

The common mode choke coil 500 includes a core 510, the leg-shaped electrode portions 515a and 515b, and windings 531a and 531b. The core 510 includes the winding core portion 511 and a flange portion 512. The winding core portion 511 is a prism-like member extending in the front-back direction. The flange portion 512 is provided at the rear end of the winding core portion 511, and protrudes from the winding core portion 511 in the top-bottom direction and the left-right direction. The leg-shaped electrode portions 515a and 515b are provided on the top surface of the flange portion 512 and are arranged in this order in the direction from right to left. A groove 513 is provided at the flange portion 512. The groove 513 is located between the leg-shaped electrode portions 515a and 515b. The bottom portion of the groove 513 and the top surface of the winding core portion 511 form a single plane surface.

The windings 531a and 531b are wound around the winding core portion 511 in a clockwise direction as viewed from the front side. The winding 531a extends toward the upper right side in the groove 513 after leaving the winding core portion 511. One end of the winding 531a is connected to the leg-shaped electrode portion 515a. One end of the winding 531b is connected to the leg-shaped electrode portion 515b.

SUMMARY

In current years, a resin coating is sometimes applied to the common mode choke coil 500 disclosed in Japanese Unexamined Patent Application Publication No. 2007-103596 for the purpose of moisture protection after the common mode choke coil 500 has been disposed on a circuit board. The inventor found that a break occurred in the winding 531a when such a resin coating was applied to the common mode choke coil 500. The inventor estimated the mechanism of the occurrence of a break in the winding as follows. FIG. 14 is a diagram illustrating a resin and the winding 531a at low temperatures. FIG. 15 is a diagram illustrating a resin and the winding 531a at high temperatures.

When a resin coating is applied to the common mode choke coil 500, a resin easily accumulates in the groove 513. The resin accumulated in the groove 513 forms a film in a triangular region A0 (see FIG. 13) surrounded by the top surface of the winding core portion 511, the winding 531a, and the flange portion 512. As a result, the winding 531a and the resin are brought into contact with each other.

When the common mode choke coil 500 is repeatedly exposed to low temperatures and high temperatures, the resin repeatedly expands and contracts. As illustrated in FIG. 13, the resin is present in the region A0 below the winding 531a. Therefore, when the resin contracts, the winding 531a is pulled downward by the resin and is bent to protrude downward as illustrated in FIG. 14. On the other hand, when the resin expands, a large force is not applied from the resin to the winding 531a because the resin softens. However, the resin expands, whereas the winding 531a remains bent as illustrated in FIG. 15. The bent winding 531a is therefore buried in the expanded resin. At the time of the next contraction, the winding 531a is further pulled downward by the resin and is further bent to protrude downward. In a case where the expansion and contraction of the resin are repeated, the degree of bending of the winding 531a becomes gradually large. This leads to the occurrence of a break in the winding 531a.

Accordingly, it is an object of the present disclosure to provide an electronic component and a circuit module which are capable of reducing the likelihood that a break occurs in a winding.

An electronic component according to an embodiment of the present disclosure includes a core, a first winding, a second winding, and an external electrode. The core includes a winding core portion extending in a first direction and a flange portion that is provided at an end portion of the winding core portion on one side in the first direction and protrudes from the winding core portion toward one side in a second direction orthogonal to the first direction. The first winding and a second winding are wound around the winding core portion. The flange portion includes a flange portion main body having a first surface that faces one side in the second direction and is located on one side in the second direction compared to the winding core portion and first and second electrode formation portions that protrude from the flange portion main body toward one side in the second direction compared to the first surface. The first electrode formation portion, at least a part of the first surface, and the second electrode formation portion are arranged in this order from one side to the other side in a third direction orthogonal to the first direction and the second direction. The first electrode formation portion has a second surface facing one side in the second direction. The external electrode is provided on the second surface and is connected to the first winding. As viewed from the first direction, a groove space surrounded by the first electrode formation portion, the second electrode formation portion, and at least a part of the first surface is formed. A section between a point at which the first winding is separated from the winding core portion and a point at which the first winding is brought into contact with the external electrode is defined as a predetermined section. An end portion of the predetermined section on one side in the third direction is located on one side in the third direction compared to the groove space. An end portion of the predetermined section on the other side in the third direction is located on the other side in the third direction compared to the groove space. The predetermined section extends toward one side in the second direction and one side in the third direction as viewed from the first direction, and does not include a portion overlapping the groove space at an entire line width of the first winding.

A circuit module according to an embodiment of the present disclosure includes the above-described electronic component, a circuit board that includes a board main body having a first main surface and a land electrode provided on the first main surface, and a coating resin. The external electrode is electrically connected to the land electrode. The coating resin covers at least a part of a surface of the electronic component.

The phrase "the normal vector of a surface extends toward one side (or the other side) in a predetermined direction" used herein means that the normal vector of the surface is parallel to the predetermined direction. The phrase "the normal vector of the surface is parallel to the predetermined direction" means that the normal vector of the surface may be parallel to the predetermined direction or may be slightly deviated from such a parallel state because of manufacturing variations. The phrase "a surface faces one side (or the other side) in a predetermined direction" means that the normal vector of the surface may be parallel to the predetermined direction or may be inclined with respect to the predetermined direction.

According to an embodiment of the present disclosure, it is possible to reduce the likelihood that a break occurs in a winding.

Other features, elements, characteristics and advantages of the present disclosure will become more apparent from the following detailed description with reference to the attached drawings.

BRIEF DESCRIPTION OF THE DRAWINGS

FIG. 1 is an external perspective view of an electronic component.

FIG. 2 is a plan view of a core in the electronic component as viewed from a bottom side.

FIG. 3 is a plan view of the core in the electronic component as viewed from a top side.

FIG. 4 is a cross-sectional structural diagram of the core taken along a line 1-1 illustrated in FIG. 2.

FIG. 7 is a cross-sectional structural diagram of a core in an electronic component that is a comparative example.

FIG. 11 is a plan view of a core as viewed from the bottom side.

FIG. 12 is a plan view of the core as viewed from the top side.

DETAILED DESCRIPTION

Embodiments

Figure 5:
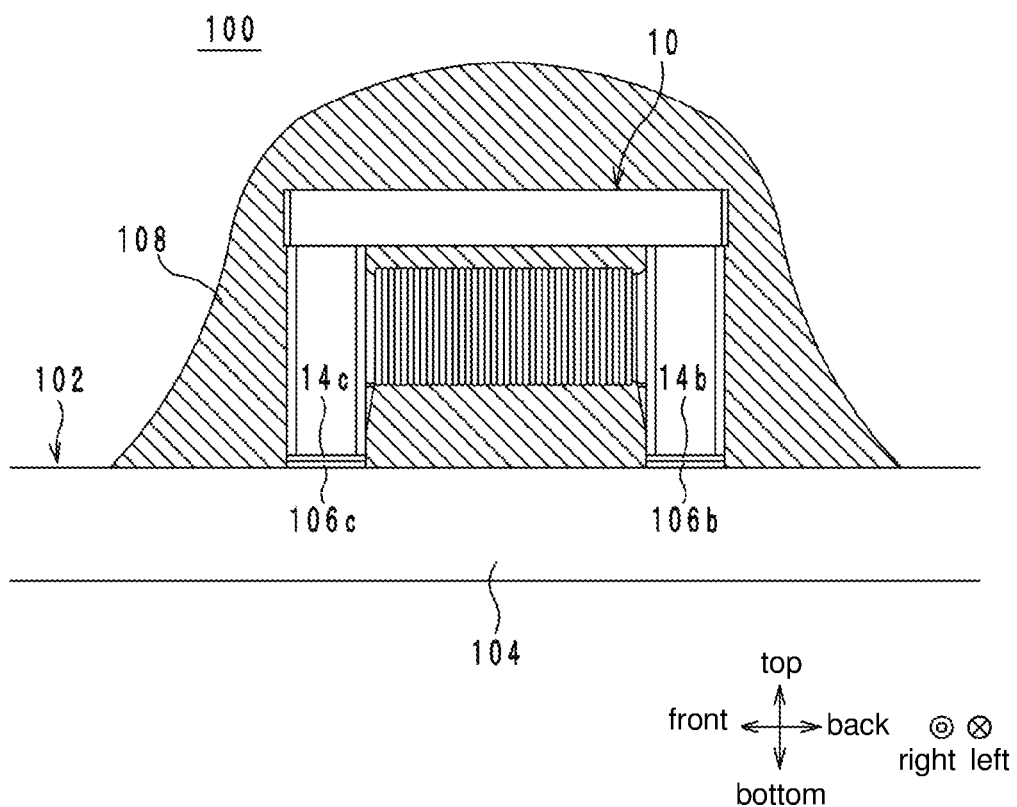
FIG. 5 is a cross-sectional structural diagram of a circuit module.

An electronic component according to an embodiment of the present disclosure and a circuit module according to an embodiment of the present disclosure will be described below with reference to the accompanying drawings. FIG. 1 is an external perspective view of an electronic component 10. FIG. 2 is a plan view of a core 12 in the electronic component 10 as viewed from a bottom side. FIG. 3 is a plan view of the core 12 in the electronic component 10 as viewed from a top side. FIG. 4 is a cross-sectional structural diagram of the core taken along a line 1-1 illustrated in FIG. 2. In FIG. 4, a section I1 between a point at which the winding 16a is separated from a winding core portion 22 and a point at which the winding 16a is brought into contact with an external electrode 14a is illustrated, and the illustration of the other portion of the winding 16a is omitted.

In the following, a direction in which the winding core portion 22 of the core 12 in the electronic component 10 extends is defined as a front-back direction (the front-back direction is an example of a first direction, a back side is an example of one side, and a front side is an example of the other side). A direction in which the external electrode 14a and an external electrode 14b are arranged is defined as a left-right direction (the left-right direction is an example of a third direction, a right side is an example of one side, and a left side is an example of the other side). The front-back direction and the left-right direction are orthogonal to each other. A direction orthogonal to the front-back direction and the left-right direction is defined as a top-bottom direction (the top-bottom direction is an example of a second direction, a top side is an example of one side, and a bottom side is an example of the other side). The front-back direction, the left-right direction, and the top-bottom direction are directions defined for the description of the electronic component 10, and do not have to conform to a front-back direction, a left-right direction, and a top-bottom direction, respectively when the electronic component 10 is used.

As illustrated in FIG. 1, the electronic component 10 includes the core 12, external electrodes 14a to 14d, windings 16a and 16b, and a top plate 18. The core 12 is made of a magnetic material such as Ni—Zn ferrite. A material for the core 12 is not limited to Ni—Zn ferrite and may be another material. As illustrated in FIGS. 1 to 3, the core 12 includes the winding core portion 22 and flange portions 24a and 24b.

As illustrated in FIG. 2, the winding core portion 22 has a substantially quadrangular column shape extending in the front-back direction. In this embodiment, the winding core portion 22 has a top surface, a bottom surface, a right surface, and a left surface. The top surface has a normal vector extending toward the top side. The bottom surface has a normal vector extending toward the bottom side. The right surface has a normal vector extending toward the right side. The left surface has a normal vector extending toward the left side. The winding core portion 22 does not necessarily have to have a substantially quadrangular column shape, and may have another shape such as a substantially cylindrical column shape.

The flange portion 24a is provided at the rear end of the winding core portion 22, and protrudes from the winding core portion 22 toward the top side, the bottom side, the right side, and the left side. The flange portion 24a is a plate-shaped member having a substantially rectangular main surface as viewed from the front side. The long sides of the flange portion 24a on the top side and the bottom side are parallel to the left-right direction and the short sides of the flange portion 24a on the right side and the left side are parallel to the top-bottom direction as viewed from the front side.

The boundary between the winding core portion 22 and the flange portion 24a will be described. As illustrated in FIG. 2, the windings 16a and 16b to be described below are wound around the winding core portion 22. In this embodiment, the cross-sectional shape of the winding core portion 22 vertical to the front-back direction is substantially uniform. The portion extending from the winding core portion 22 to the flange portion 24a in the top-bottom direction and the left-right direction is regarded not as a part of the winding core portion 22 but as a part of the flange portion 24a, because the windings 16a and 16b are not wound around the portion and the cross-sectional shape of the portion is not substantially uniform.

The flange portion 24a includes a flange main body 26a and electrode formation portions 28a and 28b. The flange main body 26a is a portion other than the electrode formation portions 28a and 28b to be described below in the flange portion 24a. The flange main body 26a has surfaces S1 and S3. The surface S1 (an example of a first surface) is the top surface of the flange main body 26a and faces the top side. The surface S1 is above the winding core portion 22. In this embodiment, the surface S1 has a normal vector extending toward the top side. The surface S1 includes a portion extending in the front-back direction between the electrode formation portions 28a and 28b to be described below and a portion extending in the left-right direction on the front side of the electrode formation portions 28a and 28b, and is substantially T-shaped. The normal vector of the surface S1 may extend to the obliquely upper side (for example, an upper front side or an upper back side).

The surface S3 (an example of a third surface) faces the front side, and is located between the surface S1 and the winding core portion 22 in the top-bottom direction. In this embodiment, the surface S3 has a normal vector extending toward the upper front side. The surface S3 is a part of the front surface of the flange main body 26a, and is, more specifically, a substantially rectangular surface connecting the top surface of the winding core portion 22 and the surface S1. The long side of the surface S3 on the bottom side is therefore in contact with the winding core portion 22. The long side of the surface S3 on the top side is in contact with the surface S1. The surface S3 may have a normal vector extending toward the front side.

The electrode formation portions 28a and 28b are portions that protrude from the surface S1 of the flange main body 26a to the top side. The electrode formation portions 28a and 28b are therefore located above the surface S1 of the flange portion 24a. Referring to FIG. 4, the electrode formation portions 28a and 28b are portions above a dotted line in the flange portion 24a. The electrode formation portion 28a, a part of the surface S1, and the electrode formation portion 28b are arranged in this order from the right side to the left side. The shapes of the electrode formation portions 28a and 28b will be described in detail below.

The electrode formation portion 28a (an example of a first electrode formation portion) has a surface S2a (an example of a second surface) facing the top side. In this embodiment, the surface S2a has a normal vector extending toward the top side. The surface S2a is substantially L-shaped as viewed from the top side. More specifically, the surface S2a includes a main portion 30a and a protrusion portion 32a as illustrated in FIG. 3. The main portion 30a has a substantially rectangular shape having long sides extending in the left-right direction. The protrusion portion 32a protrudes from the right end of the main portion 30a to the front side. The main portion 30a may have a shape other than a rectangular shape on condition that it extends in the left-right direction. The protrusion portion 32a may protrude from a position on the right side of the left end of the main portion 30a to the front side. Accordingly, the protrusion portion 32a may protrude from a position other than the right end of the main portion 30a to the front side.

The electrode formation portion 28a has a surface S4 (an example of a fourth surface) facing the left side. In this embodiment, the surface S4 has a normal vector extending toward the upper left side. The surface S4 is the left surface of the electrode formation portion 28a, and is a substantially rectangular surface connecting the surfaces S1 and S2a. In this embodiment, the surface S4 (an example of the fourth surface) is inclined with respect to the surface S2a (an example of the second surface). However, the surface S4 may have a normal vector extending toward the left side, that is, may be vertical to the surface S2a.

The electrode formation portion 28b (an example of a second electrode formation portion) has a surface S2b facing the top side. In this embodiment, the surface S2b has a normal vector extending toward the top side. The surface S2b is substantially L-shaped as viewed from the top side. More specifically, the surface S2b includes a main portion 30b and a protrusion portion 32b as illustrated in FIG. 3. The main portion 30b has a substantially rectangular shape having long sides extending in the left-right direction. The protrusion portion 32b protrudes from the left end of the main portion 30b to the front side. The main portion 30b may have a shape other than a rectangular shape on condition that it extends in the left-right direction. The protrusion portion 32b may protrude from a position on the left side of the right end of the main portion 30b to the front side. Accordingly, the protrusion portion 32b may protrude from a position other than the left end of the main portion 30b to the front side.

The electrode formation portion 28b has a surface S5 (an example of a fifth surface) facing the right side. In this embodiment, the surface S5 has a normal vector extending toward the upper right side. The surface S5 is the right surface of the electrode formation portion 28b and is a substantially rectangular surface connecting the surfaces S1 and S2b. In this embodiment, the surface S5 (an example of the fifth surface) is inclined with respect to the surface S2b (an example of the second surface). However, the surface S5 may have a normal vector extending toward the right side, that is, may be vertical to the surface S2b.

In the above-described flange portion 24a, the groove space Sp1 is formed as illustrated in FIG. 4. The groove space Sp1 is surrounded by the electrode formation portions 28a and 28b and the surface S1 as viewed from the front side. In this embodiment, the groove space Sp1 is substantially trapezoidal space surrounded by the surfaces S1, S4, and S5 as viewed from the front side. The groove space Sp1 opens on the top side, the front side, and the back side. The front surface of the groove space Sp1 is a plane connecting the side of the surface S4 on the front side and the side of the surface S5 on the front side. The rear surface of the groove space Sp1 is a plane connecting the side of the surface S4 on the back side and the side of the surface S5 on the back side. The top surface of the groove space Sp1 is a plane connecting the side of the surface S4 on the top side and the side of the surface S5 on the top side.

The external electrode 14a is provided on the surface S2a. More specifically, the external electrode 14a covers the entire surface of the surface S2a to straddle the main portion 30a and the protrusion portion 32a of the surface S2a.

The external electrode 14b is provided on the surface S2b. More specifically, the external electrode 14b covers the entire surface of the surface S2b to straddle the main portion 30b and the protrusion portion 32b of the surface S2b. The above-described external electrodes 14a and 14b are manufactured by applying Ni plating and Sn plating onto a base electrode made of Ag. Another material may be used for the external electrodes 14a and 14b.

The flange portion 24b is provided at the front end of the winding core portion 22, and protrudes from the winding core portion 22 to the top side, the bottom side, the right side, and the left side. The structure of the flange portion 24b has a rotational symmetric relation with the structure of the flange portion 24a with respect to an axis Ax (see FIG. 2) that passes through the center of the winding core portion 22 (an intersection point of diagonal lines) and extends in the top-bottom direction as viewed from the top side. The description of the structure of the flange portion 24b will therefore be omitted.

External electrodes 14c and 14d are provided on surfaces S2c and S2d, respectively. The structures of the external electrodes 14c and 14d have a rotational symmetric relation with the structures of the external electrodes 14a and 14b with respect to the axis Ax (see FIG. 2). The descriptions of the structures of the external electrodes 14c and 14d will therefore be omitted.

The windings 16a and 16b are wound around the winding core portion 22 as illustrated in FIG. 1. More specifically, the windings 16a and 16b (examples of the first winding and the second winding) extend from the front side to the back side while being wound clockwise as viewed from the front side to form a helical shape. The windings 16a and 16b extend in parallel with each other around the winding core portion 22 so that they are aligned in the front-back direction. The winding 16a and the winding 16b are therefore alternately arranged in the front-back direction on the surface of the winding core portion 22. After the winding 16a has been wound around the winding core portion 22, the winding 16b may be wound on the winding 16a. Alternatively, after the winding 16b has been wound around the winding core portion 22, the winding 16a may be wound on the winding 16b. A coil formed by the winding 16a and a coil formed by the winding 16b are magnetically coupled to each other, so that a common mode choke coil is formed. These coils may form a transformer. The windings 16a and 16b are manufactured by covering a metal wire made of, for example, Cu with an insulating resin made or, for example, enamel. The diameters of the windings 16a and 16b are, for example, approximately 0.05 mm.

A rear end t1 (an example of an end portion) is connected to the external electrode 14a. A front end t2 of the winding 16a is connected to the external electrode 14d. A rear end t3 of the winding 16b is connected to the external electrode 14b. A front end t4 of the winding 16b is connected to the external electrode 14c. The rear ends t1 and t3 and the front ends t2 and t4 are connected to the external electrodes 14a, 14b, 14d, and 14c, respectively by thermocompression bonding. More specifically, the rear ends t1 and t3 and the front ends t2 and t4 are pressed against the external electrodes 14a, 14b, 14d, and 14c, respectively by a heating tool. As a result, the coatings of the rear ends t1 and t3 and the front ends t2 and t4 are melted, metal wires are exposed, and the respective metal wires are joined to the external electrodes 14a to 14d.

In the electronic component 10, in order to reduce the likelihood that a break occurs in the winding 16a, the positional relationship between the winding 16a and the groove space Sp1 is devised. The positional relationship between the winding 16a and the groove space Sp1 will be described in more detail below with reference to FIGS. 1 to 4. A section between a point at which the winding 16a is separated from the winding core portion 22 and a point at which the winding 16a is brought into contact with an external electrode 14b is defined as the section I1 (an example of a predetermined section).

The width of the winding core portion 22 in the left-right direction is larger than that of the groove space Sp1 in the left-right direction. The winding 16a is separated from the winding core portion 22 at the upper left corner of the winding core portion 22 as illustrated in the cross-sectional view in FIG. 4. Therefore, the position at which the winding 16a is separated from the winding core portion 22 (that is, the left end of the section I1) is located on the left side of the groove space Sp1. The external electrode 14a is located on the right side of the groove space Sp1. The position at which the winding 16a is in contact with the external electrode 14a (that is, the right end of the section I1) is located on the right side of the groove space Sp1. The right end of the section I1 is above the left end of the section I1. The section I1 therefore extends from the lower left side to the upper right side as viewed from the front side. The section I1 includes a portion overlapping the surface S3 as viewed from the front side, and also extends from the lower left side to the upper right side on the surface S3.

However, in the electronic component 10, the section I1 does not overlap the groove space Sp1 when viewed from the front side as illustrated in FIG. 4. Specifically, while the section I1 extends from the lower left side to the upper right side to pass across the surface S3, the section I1 extends from the left side to the right side below the groove space Sp1 as viewed from the front side. After passing across the surface S3, the section I1 further extends from the lower left side to the upper right side to reach the external electrode 14a as viewed from the front side. The section I1 overrides the external electrode 14a from a position near a corner formed by the main portion 30a and the protrusion portion 32a.

The positional relationship between the winding 16b and the groove space Sp2 has a rotational symmetric relation with the positional relationship between the winding 16a and the groove space Sp1 with respect to the axis Ax. The detailed descriptions of the positional relationship between the winding 16b and the groove space Sp2 will therefore be omitted.

The top plate 18 is a substantially rectangular plate-shaped member as viewed from the top side. The top plate 18 is made of a magnetic material such as Ni—Zn ferrite. A material for the top plate 18 is not limited to Ni—Zn ferrite and may be another material. The top plate 18 is bonded to the bottom surfaces of the flange portions 24a and 24b using an adhesive (for example, a thermosetting epoxy resin). As a result, a closed magnetic circuit is formed by the winding core portion 22, the flange portion 24a, the top plate 18, and the flange portion 24b. The electronic component 10 does not necessarily have to include the top plate 18.

The length of the electronic component 10 having the above-described configuration in the front-back direction is, for example, approximately 3.2 mm. The width of the electronic component 10 in the left-right direction is, for example, approximately 2.5 mm. The height of the electronic component 10 in the top-bottom direction is, for example, approximately 2.5 mm. The size of the electronic component 10 is not limited to the above-described size.

The electronic component 10 is disposed on a circuit board. A circuit module including the electronic component 10 and a circuit board will be described below with reference to the accompanying drawings. FIG. 5 is a cross-sectional structural diagram of a circuit module 100. However, in FIG. 5, only the cross-section of a coating resin 108 is illustrated. Regarding the electronic component 10 and a circuit board 102, FIG. 5 illustrates the side view of them. The position of the cross-section of the coating resin 108 is the center of the electronic component 10 in the left-right direction.

The circuit module 100 includes the electronic component 10, the circuit board 102, and the coating resin 108. The circuit board 102 includes a board main body 104 and land electrodes 106a to 106d (the land electrodes 106a and 106d are not illustrated). The board main body 104 is, for example, a plate-like multilayer substrate and has a top surface (an example of a first main surface) and a bottom surface. The land electrodes 106a to 106d are provided on the top surface of the board main body 104.

The external electrodes 14a to 14d are electrically connected to the land electrodes 106a to 106d, respectively using solder or an electroconductive adhesive. As a result, the electronic component 10 is disposed on the circuit board 102. The coating resin 108 covers the whole of the electronic component 10 for the purpose of moisture protection. The coating resin 108 covering the electronic component 10, which is illustrated in FIG. 5, is formed by dropping a liquid resin onto the electronic component 10. A material for the coating resin 108 is, for example, a polyolefin resin made of, for example, polyethylene. The coating resin 108 may wholly or partly cover the electronic component 10. The coating resin 108 does not necessarily have to be formed by dropping a liquid resin onto the electronic component 10, and may be applied to the electronic component 10 by, for example, spraying.

(Effects)

Using the electronic component 10 having the above-described configuration, it is possible to reduce the likelihood that a break occurs in the windings 16a and 16b. Since the same principle of reducing the likelihood that a break occurs in a winding can be said for the windings 16a and 16b, the description of this principle will be made taking the winding 16a as an example.

In the electronic component 10, the section I1 does not overlap the groove space Sp1 as viewed from the front side. The coating resin 108 accumulated in the groove space Sp1 hardly comes into contact with the section I1. Therefore, even if the electronic component 10 is repeatedly exposed to low temperatures and high temperatures, the section I1 is hardly pulled into the groove space Sp1 on the back side by the coating resin 108 accumulated in the groove space Sp1. As a result, it is possible to reduce the likelihood that a break occurs in the winding 16a.

Figure 6:
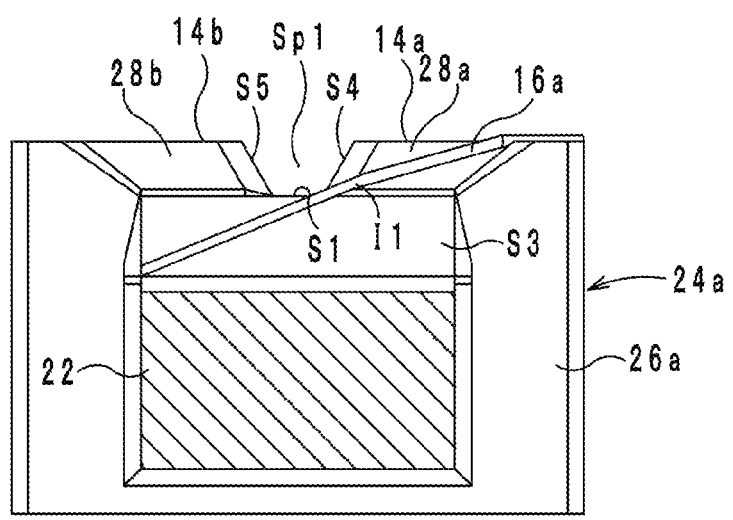
FIG. 6 is a cross-sectional structural diagram of a core in an electronic component that is a modification.

In the electronic component 10, the section I1 may slightly overlap the groove space Sp1 as viewed from the front side. The positional relationship between the section I1 and the groove space Sp1 will be described below. FIG. 6 is a cross-sectional structural diagram of a core in an electronic component that is a modification. FIG. 7 is a cross-sectional structural diagram of a core in an electronic component that is a comparative example.

As illustrated in FIG. 6, a part of the line width of the winding 16a may overlap the groove space Sp1 as viewed from the front side. Referring to FIG. 6, a part of the half of the line width of the section I1 overlaps the groove space Sp1 as viewed from the front side. In this case, the coating resin 108 accumulated in the groove space Sp1 slightly comes into contact with the section I1. Since the amount of the coating resin 108 that is in contact with the section I1 is small, a force added to the section I1 is also small. It is therefore possible to reduce the likelihood that a break occurs in the winding 16a.

In addition, in the electronic component that is a modification, the section I1 partly overlap the surface S3 as viewed from the front side. Even if the section I1 is pulled into the groove space Sp1 on the back side by the coating resin 108, the section I1 is caught by the surface S3. As a result, it is possible to prevent the section I1 from being sharply bent after being pulled. This can reduce the likelihood that a break occurs in the winding 16a.

However, the entire line width of the winding 16a must not overlap the groove space Sp1 as viewed from the front side. More specifically, referring to FIG. 7, the entire line width of the winding 16a overlaps the groove space Sp1 as viewed from the front side. That is, the section I1 includes a portion the entire line width of which overlaps the groove space Sp1 as viewed from the front side. In this case, a large amount of the coating resin 108 accumulated in the groove space Sp1 comes into contact with the section I1. A force added from the coating resin 108 accumulated in the groove space Sp1 to the section I1 is also large. Accordingly, in an electronic component including the core illustrated in FIG. 7, a break may occur in the winding 16a.

In the electronic component that is a comparative example, triangular space is formed by the section I1 and the surfaces S1 and S4 as viewed from the front side. In this triangular space, the coating resin 108 forms a film. If such an electronic component is repeatedly exposed to low temperatures and high temperatures, the film of the coating resin 108 repeatedly expands and contracts. When the film of the coating resin 108 contracts, the section I1 is pulled downward by the film of the coating resin 108 and is bent to protrude downward. On the other hand, when the film of the coating resin 108 expands, a large force is not applied from the film of the coating resin 108 to section I1 because the film of the coating resin 108 softens. However, the film of the coating resin 108 expands, whereas the section I1 remains bent. The bent section I1 is therefore buried in the expanded film of the coating resin 108. At the time of the next contraction, the section I1 is further pulled downward by the film of the coating resin 108 and is further bent to protrude downward. In a case where the expansion and contraction of the film of the coating resin 108 are repeated, the degree of bending of the section I1 becomes gradually large. This leads to the occurrence of a break in the winding 16a. For this reason, the entire line width of the section I1 of the winding 16a must not overlap the groove space Sp1 as viewed from the front side like in the electronic component 10 and the electronic component that is a modification.

Using the electronic component 10, it is possible to reduce the likelihood that a break occurs in the windings 16a and 16b for the following reason. Since the same principle of reducing the likelihood that a break occurs in a winding can be said for the windings 16a and 16b, the description of this principle will be made taking the winding 16a as an example.

In the electronic component 10, the section I1 extends toward the upper back side. Therefore, when the surface S3 has a normal vector extending toward the upper front side, the section I1 and the surface S3 easily come into line contact with each other. Even if the section I1 is pulled to the back side by the coating resin 108, the section I1 is therefore caught by the surface S3. Since the section I1 and the surface S3 have line contact, a force added from the surface S3 is dispersed over a wide part of the section I1. As a result, it is possible to reduce the likelihood that a break occurs in the winding 16a.

Figure 8:
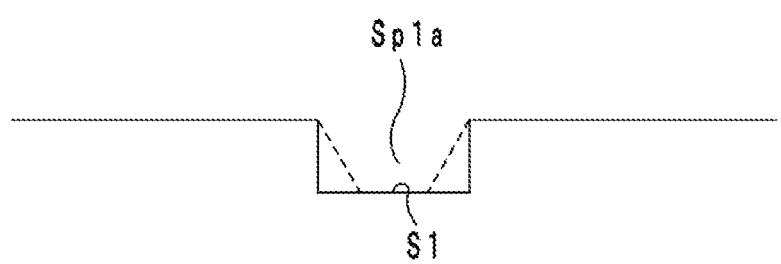
FIG. 8 is a plan view of groove space that is a first reference as viewed from a front side.
Figure 9:
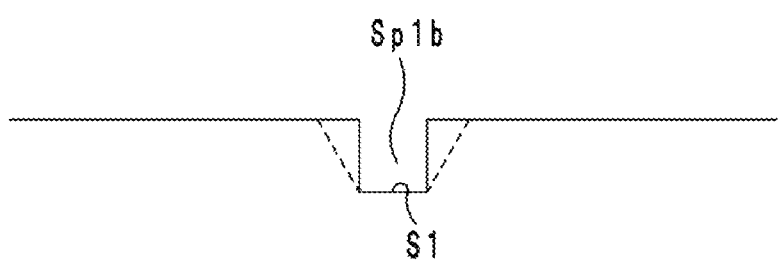
FIG. 9 is a plan view of groove space that is a second reference as viewed from the front side.

Using the electronic component 10, it is possible to reduce both the likelihood that a break occurs in the winding 16a and the likelihood that a short circuit occurs between the external electrodes 14a and 14b. FIG. 8 is a plan view of groove space Sp1a that is a first reference as viewed from the front side. FIG. 9 is a plan view of groove space Sp1b that is a second reference as viewed from the front side. FIG. 8 illustrates the groove spaces Sp1a and Sp1 overlapping each other. FIG. 9 illustrates the groove spaces Sp1b and Sp1 overlapping each other. In FIGS. 8 and 9, the groove space Sp1 is represented by a dotted line. Both the groove space Sp1a that is the first reference and the groove space Sp1b that is the second reference are used to describe effects, and are embodiments of the present disclosure.

More specifically, the groove space Sp1a illustrated in FIG. 8 is substantially rectangular in shape as viewed from the front side. The width of the groove space Sp1a in the left-right direction is the same as the width of the top surface of the groove space Sp1 in the left-right direction. The distance between the external electrodes 14a and 14b therefore becomes long, and the likelihood that a short circuit occurs between the external electrodes 14a and 14b can therefore be reduced.

However, the area of the groove space Sp1a is larger than that of the groove space Sp1. The amount of resin accumulated in the groove space Sp1a is larger than that accumulated in the groove space Sp1. The likelihood that the resin accumulated in the groove space Sp1a comes into contact with the section I1 is higher than the likelihood that the resin accumulated in the groove space Sp1 comes into contact with the section I1. Accordingly, the likelihood that a break occurs in the winding 16a in an electronic component in which the groove space Sp1a is employed is higher than that in the electronic component 10 in which the groove space Sp1 is employed.

On the other hand, the groove space Sp1b illustrated in FIG. 9 is substantially rectangular in shape as viewed from the front side. The width of the groove space Sp1b in the left-right direction is the same as the width of the bottom surface (the surface S1) of the groove space Sp1 in the left-right direction. The area of the groove space Sp1b therefore becomes small, and the likelihood that a break occurs in the winding 16a can therefore be reduced.

However, the distance between the external electrodes 14a and 14b in an electronic component in which the groove space Sp1b is employed is shorter than that in the electronic component 10 in which the groove space Sp1 is employed. Accordingly, the likelihood that a short circuit occurs between the external electrodes 14a and 14b in an electronic component in which the groove space Sp1b is employed is higher than that in the electronic component 10 in which the groove space Sp1 is employed.

Thus, using the groove spaces Sp1a and Sp1b that are substantially rectangular in shape as viewed from the front side, it is difficult to achieve both the reduction in the likelihood that a break occurs in the winding 16a and the reduction in the likelihood that a short circuit occurs between the external electrodes 14a and 14b.

In the electronic component 10, the surface S4 has a normal vector extending toward the upper left side and the surface S5 has a normal vector extending toward the upper right side. It is therefore possible to reduce the area of the groove space Sp1 while increasing the distance between the external electrodes 14a and 14b. As a result, it is possible to achieve both the reduction in the likelihood that a break occurs in the winding 16a and the reduction in the likelihood that a short circuit occurs between the external electrodes 14a and 14b in the electronic component 10. For the same reason, in the electronic component 10, it is possible to achieve both the reduction in the likelihood that a break occurs in the winding 16b and the reduction in the likelihood that a short circuit occurs between the external electrodes 14c and 14d.

The surface S4 may have a normal vector extending toward the upper left side, and the surface S5 may have a normal vector extending toward the right side. Alternatively, the surface S4 may have a normal vector extending toward the left side, and the surface S5 may have a normal vector extending toward the upper right side. In a case where it is unnecessary to achieve both the reduction in the likelihood that a break occurs in the winding 16a and the reduction in the likelihood that a short circuit occurs between the external electrodes 14a and 14b, the groove space Sp1a or Sp1b that is substantially rectangular in shape as viewed from the front side may be employed in an electronic component.

Using the electronic component 10, it is possible to reduce the likelihood that a break occurs in the windings 16a and 16b also for the following reason. Since the same principle of reducing the likelihood that a break occurs in a winding can be said for the windings 16a and 16b, the description of this principle will be made taking the winding 16a as an example. In the electronic component 10, the winding 16a in the section I1 linearly extends from the lower left side to the upper right side along the surface S3. Since the flange portion 24a has the surface S3 that is connected to the winding core portion 22 and is inclined with respect to the winding core portion 22, the winding 16a in the section I1 can be in a surface contact with the flange portion 24a without being bent. It is therefore possible to reduce the likelihood that a break occurs in the winding 16a during manufacturing.

Furthermore, using the electronic component 10, the rear end t1 of the winding 16a is easily connected to the external electrode 14a. More specifically, in a case where the surface S2a is not substantially L-shaped but substantially rectangular in shape, the winding 16a passes through the long side of the external electrode 14a on the front side and overrides the external electrode 14a. The rear end t1 of the winding 16a is located near the long side of the external electrode 14a on the front side. In this case, when the rear end t1 is press-bonded, the rear end t1 may drop to the front side of the external electrode 14a.

On the other hand, the surface S2a is substantially L-shaped as viewed from the top side. More specifically, the surface S2a is substantially L-shaped and includes the main portion 30a and the protrusion portion 32a. The main portion 30a has a rectangular shape having a long side extending in the left-right direction. The protrusion portion 32a protrudes from the right end of the main portion 30a to the front side. The external electrode 14a straddles the main portion 30a and the protrusion portion 32a. When the winding 16a passes through the long side of the main portion 30a on the front side and overrides the external electrode 14a, the protrusion portion 32a is therefore located on the front side of the rear end t1 of the winding 16a. As a result, when the rear end t1 is press-bonded, the rear end t1 can be prevented from dropping to the front side of the external electrode 14a. The rear end t1 of the winding 16a and the external electrode 14a can therefore be easily connected. For the same reason, the front end t4 of the winding 16b and the external electrode 14c can be easily connected.

Figure 10:
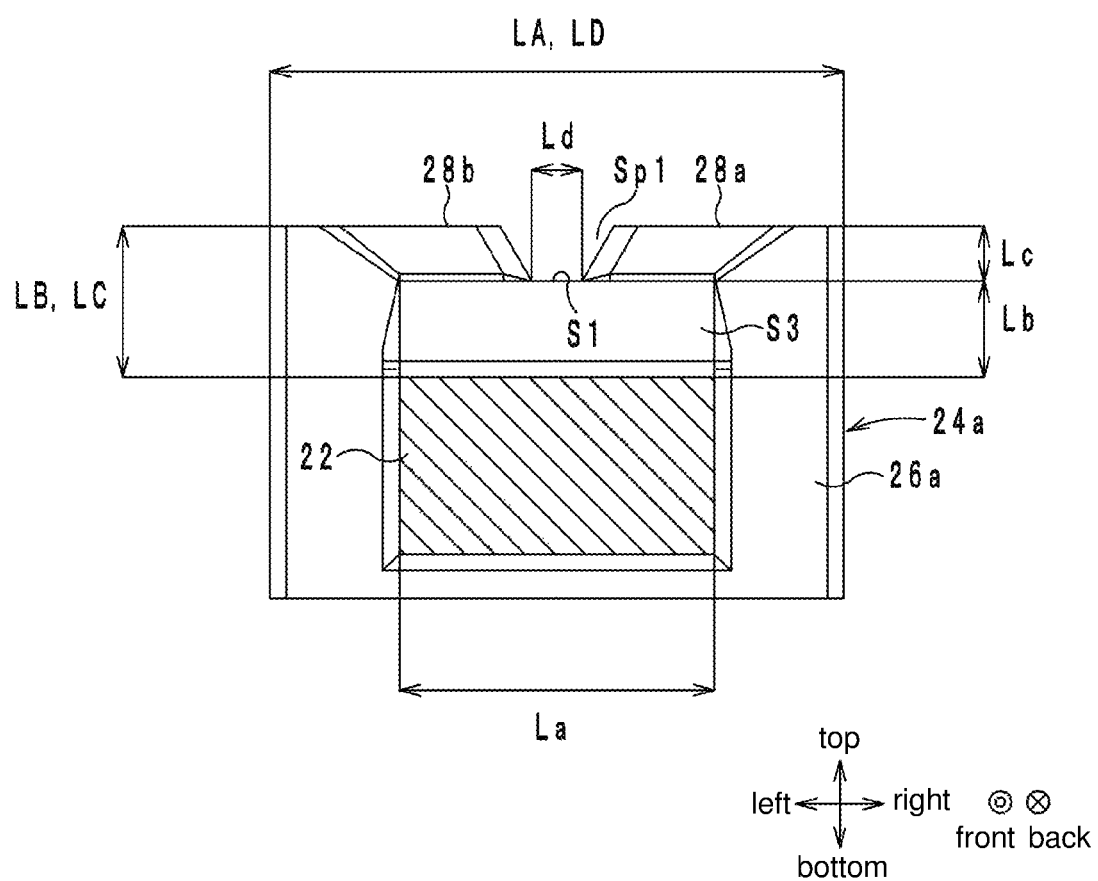
FIG. 10 is a diagram illustrating the size of each portion in first to third samples.
Figure 13:
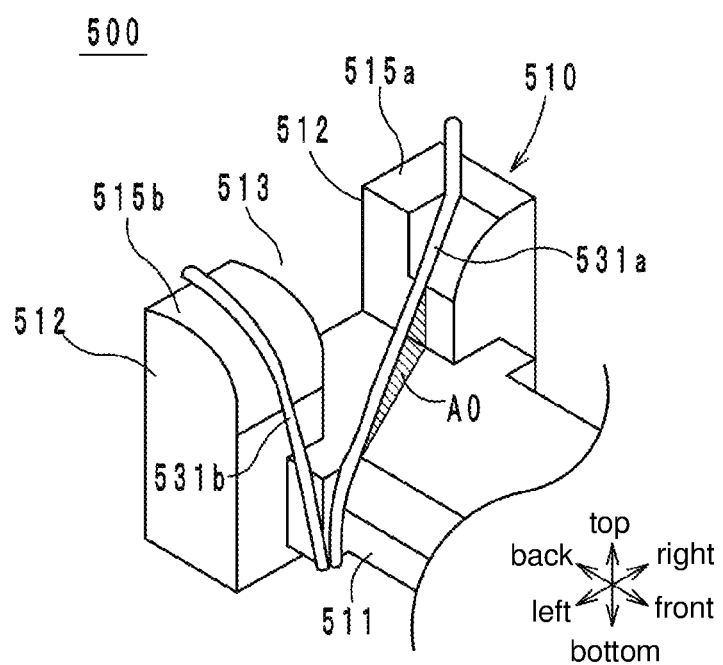
FIG. 13 is a perspective view of a common mode choke coil disclosed in Japanese Unexamined Patent Application Publication No. 2007-103596.
Figure 14:
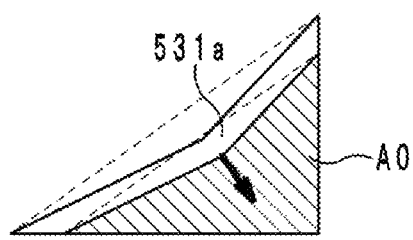
FIG. 14 is a diagram illustrating a resin and a winding at low temperatures.
Figure 15:
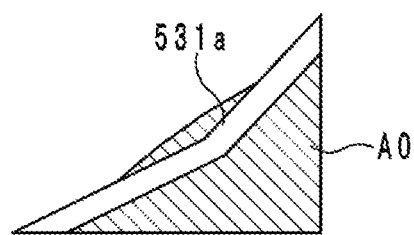
FIG. 15 is a diagram illustrating the resin and the winding at high temperatures.

The inventor conducted an experiment to be described below to determine whether the likelihood that a break occurs in the winding 16a can be reduced in the electronic component 10. Specifically, the inventor made first to third samples. The first to third samples will be described below with reference to the accompanying drawing. FIG. 10 is a diagram illustrating the dimension of each portion in the first to third samples. FIG. 10 is a cross-sectional structural diagram that is the same as the cross-sectional structural diagram illustrated in FIG. 4. In the drawing, LA and LD represent the width of the flange portion 24a in the left-right direction, LB and LC represent a distance from the top surface of the winding core portion 22 to the upper end of flange portion 24a, La represents the width of the winding core portion 22 in the left-right direction, Lb represents the height of the surface S3 in the top-bottom direction, Lc represents the height of the electrode formation portions 28a and 28b in the top-bottom direction, and Ld represents the width of the surface S1 in the left-right direction.

The inventor changed the La/LA, Lb/LB, Lc/LC, and Ld/LD as represented by the following table 1.

TABLE 1

|  | First Sample | Second Sample | Third Sample |
|---|---|---|---|
| La/LA | 0.56 | 0.75 | 0.75 |
| Lb/LB | 0.62 | 0.25 | 0 |
| Lc/LC | 0.38 | 0.75 | 1 |
| Ld/LD | 0.08 | 0.2 | 0.25 |

As represented by Table 1, the values of Lb/LB in the second and third samples are less than the value of Lb/LB in the first sample. This means that the height of the surface S3 in the top-bottom direction is low in the second sample and the surface S3 is not present in the third sample. In the second and third samples, the section I1 of the winding 16a therefore includes a portion the entire line width of which overlaps the groove space Sp1 as viewed from the front side. That is, the second and third samples correspond to electronic components that are comparative examples. On the other hand, in the first sample, the section I1 does not overlap the groove space Sp1 as viewed from the front side. That is, the first sample corresponds to an electronic component according to an embodiment of the present disclosure. The inventor found that the section I1 hardly overlapped the groove space Sp1 as viewed from the front side in a case where the core 12 was designed so that La/LA, Lb/LB, Lc/LC, and Ld/LD fell within the following range.

$$0.47 \leq La/LA \leq 0.57$$

$$0.45 \leq Lb/LB \leq 0.76$$

$$0.23 \leq Lc/LC \leq 0.45$$

$$0.04 \leq Ld/LD \leq 0.12$$

Circuit modules were fabricated by disposing 30 each of the first to third samples on circuit boards and applying coating resins to the circuit boards. A first process of exposing each circuit module to a low temperature of $-40°$ C. for 60 minutes and a second process of exposing each circuit module to a high temperature of $90°$ C. for 40 minutes are alternately repeated. One cycle means that the first process and the second process are performed once each. Regarding the third sample, breaks occurred in two samples among 30 samples at the end of 150 cycles and breaks occurred in 4 samples among remaining 28 samples at the end of 500 cycles. Regarding the second sample, breaks occurred.

On the other hand, regarding the first sample, no break occurred in all samples at the end of 2000 cycles. It is found from this experiment that the likelihood that a break occurs in the winding 16a can be reduced by preventing the section I1 from overlapping the groove space Sp1 as viewed from the front side.

(First Modification)

A core 12a that is the first modification will be described with reference to the accompanying drawings. FIG. 11 is a plan view of the core 12a as viewed from the bottom side. FIG. 12 is a plan view of the core 12a as viewed from the top side.

The core 12a differs from the core 12 in the structure of the flange portions 24a and 24b. The core 12a will be described below focusing on a different point.

The flange portion 24a protrudes from the winding core portion 22 to the bottom side, and has surfaces S6 (an example of a sixth surface), S7, S8, and S9. The surface S6 is located on the bottom side of the winding core portion 22 and faces the front side. Both ends of the surface S6 in the left-right direction are substantially coincident with both ends of the winding core portion 22 in the left-right direction as viewed from the top side. The surface S6 is inclined with respect to a surface orthogonal to the front-back direction so as to extend toward the back side while extending toward the left side as viewed from the bottom side.

The surface S7 is adjacent to the surface S6 on the right side and has a normal vector extending toward the front side. The surface S8 is adjacent to the surface S6 on the left side and has a normal vector extending to the front side. That is, the surfaces S7 and S8 are parallel to the surface orthogonal to the front-back direction. The surface S9 is the rear surface of the flange portion 24a and has a normal vector extending toward the back side.

In the flange portion 24a illustrated in FIG. 11, the distance between the surfaces S7 and S9 is longer than that between the surfaces S8 and S9. As illustrated in FIG. 12, the length of the protrusion portion 32a in the front-back direction is longer than that of the protrusion portion 32b in the front-back direction.

The flange portion 24b protrudes from the winding core portion 22 toward the bottom side, and has surfaces S16, S17, S18, and S19. The surface S16 is located on the bottom side of the winding core portion 22 and faces the back side. Both ends of the surface S16 in the left-right direction are substantially coincident with both ends of the winding core portion 22 in the left-right direction as viewed from the top side. The surface S16 is inclined with respect to a surface orthogonal to the front-back direction so as to extend toward the back side while extending toward the left side as viewed from the bottom side.

The surface S17 is adjacent to the surface S16 on the right side and has a normal vector extending toward the back side. The surface S18 is adjacent to the surface S16 on the left side and has a normal vector extending toward the back side. That is, the surfaces S17 and S18 are parallel to the surface orthogonal to the front-back direction. The surface S19 is the front surface of the flange portion 24b and has a normal vector extending toward the front side.

In the flange portion 24b illustrated in FIG. 11, the distance between the surfaces S18 and S19 is longer than that between the surfaces S17 and S19. As illustrated in FIG. 12, the length of the protrusion portion 32c in the front-back direction is longer than that of the protrusion portion 32d in the front-back direction.

The windings 16a and 16b are wound around the core 12a like the core 12. That is, the windings 16a and 16b extend from the front side to the back side while being wound clockwise around the winding core portion 22 of the core 12a when viewed from the front side as illustrated in FIG. 1. In this case, a portion of the winding 16a wound around the winding core portion which is nearest to the back side extends from the right front side to the left back side on the bottom surface of the winding core portion 22. That is, the winding 16a extends along the surface S6. The length of the winding 16a that is in contact with the core 12 therefore increases, and the inductance value of a coil formed by the winding 16a increases. For the same reason, the inductance value of a coil formed by the winding 16b increases.

Using an electronic component including the core 12a, the reliability of connection between the rear end t1 of the winding 16a and the external electrode 14a can be improved. More specifically, the surface S2a includes the main portion 30a and the protrusion portion 32a and is substantially L-shaped as viewed from the top side. The main portion 30a has a substantially rectangular shape having a long side extending in the left-right direction. The protrusion portion 32a protrudes from the right end of the main portion 30a to the front side. The external electrode 14a straddles the main portion 30a and the protrusion portion 32a. When the winding 16a passes through the long side of the main portion 30a on the front side and overrides the external electrode 14a, the protrusion portion 32a is therefore located on the front side of the rear end t1 of the winding 16a. In particular, the length of the protrusion portion 32a of the core 12a in the front-back direction is longer than that of the protrusion portion 32b of the core 12 in the front-back direction. When the rear end t1 is press-bonded, the rear end t1 can be further prevented from dropping to the front side of the external electrode 14a using the core 12a as compared with a case where the core 12 is used. As a result, the reliability of connection between the rear end t1 of the winding 16a and the external electrode 14a can be improved. For the same reason, the reliability of connection between the front end t4 of the winding 16b and the external electrode 14c can be further improved.

(Other Embodiments)

An electronic component according to an embodiment of the present disclosure and a circuit module according to an embodiment of the present disclosure are not limited to the electronic component 10, an electronic component including the core 12a, and the circuit module 100, and changes may be made thereto without departing from the scope of the present disclosure.

The configurations of the electronic component 10, an electronic component including the core 12a, and the circuit module 100 may be optionally combined.

The front surfaces of the electrode formation portions 28a and 28b may be directly connected to the surface S3. More specifically, as illustrated in FIG. 1, the front surfaces of the electrode formation portions 28a and 28b are located on the back side of the surface S3. The surface S1 is therefore present on the front side of the electrode formation portions 28a and 28b. The front surfaces of the electrode formation portions 28a and 28b may be directly connected to the surface S3. In this case, the surface S1 is not present on the front side of the electrode formation portions 28a and 28b. The whole of the surface S1 is therefore located between the electrode formation portions 28a and 28b.

As described above, the present disclosure is useful for an electronic component and a circuit module, and, in particular, has an advantage in its suitability for reducing the likelihood that a break occurs in a winding.

While some embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. An electronic component comprising:
   a core including a winding core portion extending in a first direction and a flange portion that is provided at an end portion of the winding core portion on one side in the first direction and protrudes from the winding core portion toward one side in a second direction orthogonal to the first direction;
   a first winding and a second winding which are wound around the winding core portion; and
   an external electrode,
   wherein the flange portion includes,
      a flange portion main body having a first surface that faces the one side in the second direction and is located on the one side in the second direction compared to the winding core portion and,
      a first electrode formation portion and a second electrode formation portion that protrude from the flange portion main body toward the one side in the second direction compared to the first surface,
   wherein the first electrode formation portion, at least a part of the first surface, and the second electrode formation portion are arranged in this order from one side to the other side in a third direction orthogonal to the first direction and the second direction,
   wherein the first electrode formation portion has a second surface facing the one side in the second direction,
   wherein the external electrode is provided on the second surface and is connected to the first winding,
   wherein, as viewed from the first direction, a groove space surrounded by the first electrode formation portion, the second electrode formation portion, and at least a part of the first surface is formed,
   wherein a section between a point at which the first winding is separated from the winding core portion and a point at which the first winding is brought into contact with the external electrode is defined as a predetermined section,
   wherein an end portion of the predetermined section on the one side in the third direction is located on the one side in the third direction compared to the groove space,
   wherein an end portion of the predetermined section on the other side in the third direction is located on the other side in the third direction compared to the groove space, and
   wherein the predetermined section extends toward the one side in the second direction and the one side in the third direction as viewed from the first direction, and does not include a portion overlapping the groove space at an entire line width of the first winding.

2. The electronic component according to claim 1,
   wherein the flange portion main body has a third surface that faces the other side in the first direction and is located between the first surface and the winding core portion in the second direction, and wherein the predetermined section includes a portion overlapping the third surface as viewed from the first direction.

3. The electronic component according to claim 2, wherein the third surface has a normal vector extending toward the other side in the first direction and the one side in the second direction.

4. The electronic component according to claim 1, wherein the first electrode formation portion has a fourth surface facing the other side in the third direction, wherein the second electrode formation portion has a fifth surface facing the one side in the third direction, wherein the groove space is surrounded by at least a part of the first surface, the fourth surface, and the fifth surface as viewed from the first direction, and wherein at least one of the fourth surface has a normal vector extending toward the other side in the third direction and the one side in the second direction, and the fifth surface has a normal vector extending toward the one side in the third direction and the one side in the second direction.

5. The electronic component according to claim 1, wherein the second surface includes a main portion and a protrusion portion, wherein the main portion extends in the third direction as viewed from the second direction, wherein the protrusion portion protrudes toward the other side in the first direction from a position that is apart from an end portion of the main portion on the other side in the third direction and is located on the one side in the third direction compared to the end portion, and wherein the external electrode straddles the main portion and the protrusion portion.

6. The electronic component according to claim 1, wherein the flange portion protrudes from the winding core portion toward the other side in the second direction and has a sixth surface, wherein the sixth surface is located on the other side in the second direction compared to the winding core portion and faces the other side in the first direction, and wherein the sixth surface is inclined with respect to a surface orthogonal to the first direction so as to extend toward the one side in the first direction while extending toward the other side in the third direction as viewed from the second direction.

7. A circuit module comprising:

the electronic component according to claim 1;

a circuit board that includes a board main body having a first main surface and a land electrode provided on the first main surface; and a coating resin, wherein the external electrode is electrically connected to the land electrode, and wherein the coating resin covers at least a part of a surface of the electronic component.

* * * * *